(12) United States Patent
Tan et al.

(10) Patent No.: US 7,311,420 B2
(45) Date of Patent: Dec. 25, 2007

(54) OPTO-ELECTRONIC PACKAGE, AND METHODS AND SYSTEMS FOR MAKING AND USING SAME

(75) Inventors: Siew Kim Tan, Kedah (MY); Sundar Yoganandan, Penang (MY); Akira Takekuma, Tokyo (JP)

(73) Assignee: Avago Technologies ECBUIP Pte Ltd

( * ) Notice: Subject to any disclaimer, the term of this patent is extended or adjusted under 35 U.S.C. 154(b) by 204 days.

(21) Appl. No.: 11/208,834

(22) Filed: Aug. 22, 2005

(65) Prior Publication Data

US 2007/0041186 A1    Feb. 22, 2007

(51) Int. Cl.
*F21V 11/00* (2006.01)

(52) U.S. Cl. .................. 362/240; 362/249; 362/800; 257/89

(58) Field of Classification Search ............. 362/217, 362/231, 240, 246, 249, 261, 613, 800; 257/89, 257/96, 97, 100
See application file for complete search history.

(56) References Cited

U.S. PATENT DOCUMENTS

| | | | | |
|---|---|---|---|---|
| 4,271,408 | A | * | 6/1981 | Teshima et al. ............... 345/83 |
| 4,630,180 | A | * | 12/1986 | Muraki et al. ............... 362/223 |
| 4,774,434 | A | * | 9/1988 | Bennion ...................... 313/500 |
| 4,847,734 | A | * | 7/1989 | Katoh et al. ................. 362/555 |
| 5,381,309 | A | * | 1/1995 | Borchardt ................... 362/612 |
| 5,708,428 | A | | 1/1998 | Phillips |
| 5,814,533 | A | | 9/1998 | Shakuda |
| 6,007,209 | A | | 12/1999 | Pelka |
| 6,331,063 | B1 | * | 12/2001 | Kamada et al. ............. 362/237 |
| 6,393,183 | B1 | | 5/2002 | Worley |
| 6,507,049 | B1 | * | 1/2003 | Yeager et al. ................ 257/100 |
| 6,598,998 | B2 | | 7/2003 | West et al. |
| 6,607,286 | B2 | | 8/2003 | West et al. |
| 6,611,000 | B2 | * | 8/2003 | Tamura et al. ................ 257/80 |
| 6,679,621 | B2 | | 1/2004 | West et al. |
| 6,864,509 | B2 | | 3/2005 | Worley |
| 6,874,910 | B2 | * | 4/2005 | Sugimoto et al. ........... 362/294 |
| 6,936,855 | B1 | * | 8/2005 | Harrah ........................ 257/88 |
| 7,001,035 | B2 | * | 2/2006 | Kawakami ................... 362/617 |
| 2002/0163006 | A1 | | 11/2002 | Yoganandan et al. |
| 2004/0208210 | A1 | | 10/2004 | Inoguchi |
| 2006/0268551 | A1 | * | 11/2006 | Mok et al. .................. 362/294 |

FOREIGN PATENT DOCUMENTS

WO    WO2004/003655 A1    1/2004

* cited by examiner

*Primary Examiner*—Sandra O'Shea
*Assistant Examiner*—Gunyoung T. Lee

(57) ABSTRACT

In one embodiment, an opto-electronic package includes a substrate, a cavity, mounting pads and transverse walls interspersed along the cavity, pads separated by transverse walls, and transverse walls being lower than cavity-defining walls; and LED dice mounted to the pads. In another embodiment, a system is disclosed for backlighting an LCD screen. The system includes an opto-electronic package having a substrate; LED dice mounted to the substrate; an encapsulant disposed over LED dice; and a light guide having an input portion to receive light provided by LED dice, the input portion in attachment to encapsulant, and an output portion configured to transmit light to LCD screen. In yet another embodiment, a method of manufacturing an opto-electronic package includes: fabricating a substrate; attaching LED dice to the substrate; electrically connecting each LED dice to an outer portion of the substrate; and disposing encapsulant over the LED dice.

26 Claims, 13 Drawing Sheets

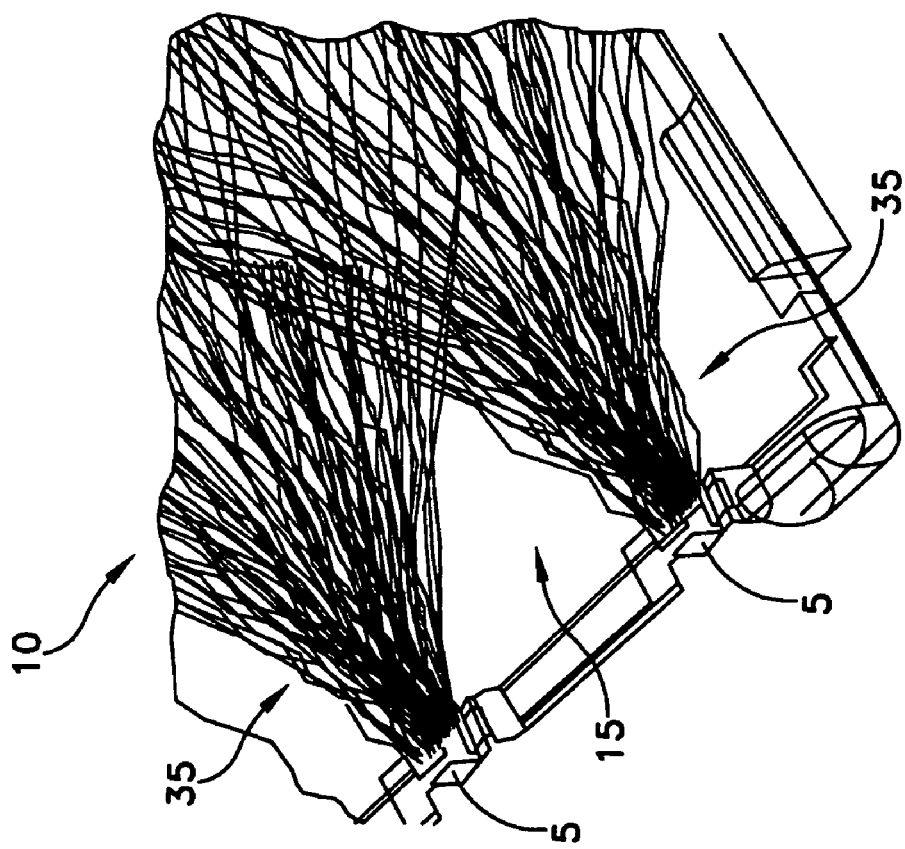
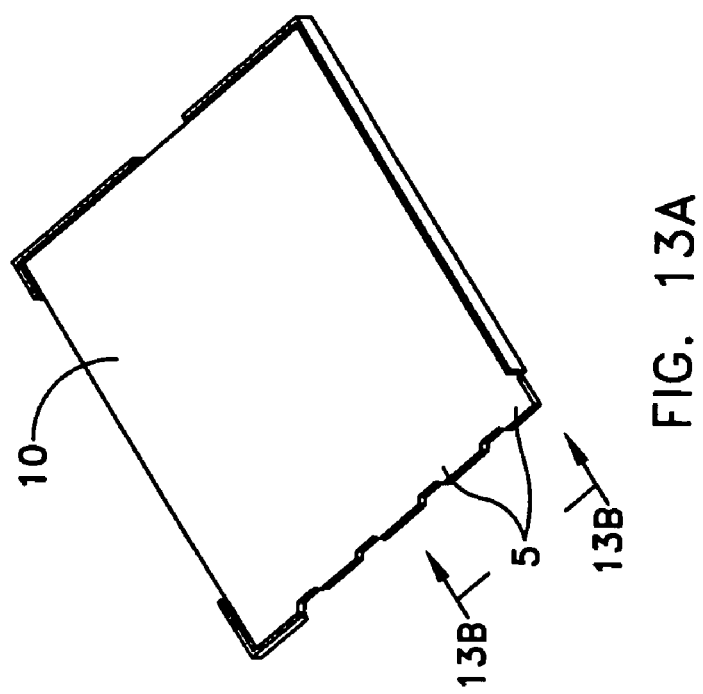
FIG. 13B
FIG. 13A

OPTO-ELECTRONIC PACKAGE, AND METHODS AND SYSTEMS FOR MAKING AND USING SAME

BACKGROUND

In order to produce white light for small screen LCD backlighting, it is now common to position red LED dice, green LED dice and blue LED dice together in one package. Various configurations of red, green and blue LED dice which attempt to address problems concerning light mixing and thermal management. There are well known problems with producing a well-mixed white light from a combination of red, green and blue LED dice within a constrained space. There is the problem of heat sinking and heat dissipation for light sources in the LCD display. There is also the problem of mixing multiple-colored light sources to provide a uniform color and a uniform luminance for the LCD backlighting. Furthermore, there are the issues with respect to minimizing the hot spot area and increasing the active area on the LCD.

Referring to FIGS. 12A, 12B, 13A and 13B, there is shown a side emitting LED package 5. In FIGS. 12A and 12B, there is shown a light guide plate 10 coupled to side emitting LED package 5. There are several disadvantages of this typical backlighting configuration. Generally, color mixing is not optimum due to the wide pitch between adjacent LED packages 5 so as to cause dark spots 15, which in turn cause hot spots and reduce the active area for the LCD.

Side emitting LED die 20, which is also referred to as LED chip 20, is positioned within package 5 and electrically and thermally connected to the surrounding environment by an electrical and heat conductor 25 together with a wire connector 30 to the top portion of LED chip 20. As such, heat generated by LED die 5 is dissipated through an electrical and heat conductor 25. This is not an optimum configuration to effectively dissipate heat to the ambient atmosphere. This sub-optimum configuration is due to the relatively long heat path provided by electrical and heat pathway, which causes a relatively high amount thermal resistance.

Light 35 is produced by LED die 20 within each LED package 5. A cavity 40 is provided within each of LED packages 5 and each cavity 40 contains a single LED die 20. This configuration allows combinations of side emitting LED packages 5 which together provide a relatively small range of colors. The range of colors is limited in that each LED die 20 emits a single color of light 35, and LED dice 20 are disposed relatively far apart from one another along light guide 10.

Thinner light guides and smaller product packages are necessary for thinner LCD displays. In order to provide a the largest possible aperture opening in a high quality LCD screen, product thickness and height should be reduced to dimensions as small possible with improved light coupling with the light guide. In order to provide good color mixing, red, green and blue LED dice should be placed close to each other while simultaneously providing an efficient heat path to ambient temperature.

SUMMARY OF THE INVENTION

In one embodiment, there is provided an opto-electronic package comprising a substrate having a base and a plurality of cavity-defining walls, the base and the plurality of cavity-defining walls defining an elongate cavity having a major axis and an aperture, the base having a surface that presents within the cavity, the surface of the base that presents within the cavity having a plurality of mounting pads and a plurality of transverse walls that are interspersed along the major axis of the cavity, wherein the mounting pads are separated by the transverse walls, and wherein the transverse walls have lower heights than the cavity-defining walls; and a plurality of light emitting diode (LED) dice mounted to the mounting pads of the substrate so as to project light within the cavity.

In another embodiment, there is provided a system for backlighting an LCD screen, the system comprising an opto-electronic package comprising a substrate having a base and a plurality of cavity-defining walls, the base and the plurality of cavity-defining walls defining an elongate cavity having a major axis and an aperture, the base having a surface that presents within the cavity, the surface of the base that presents within the cavity having a plurality of mounting pads and a plurality of transverse walls that are interspersed along the major axis of the cavity, wherein the mounting pads are separated by the transverse walls, and wherein the transverse walls have lower heights than the cavity-defining walls; and a plurality of light emitting diode (LED) dice mounted to the mounting pads of the substrate so as to project light within the cavity, wherein at least two of the LED dice project light having different colors from one another, wherein the lower heights of the transverse walls enable the different color projected light from the plurality of LED dice to mix within the cavity to form a uniform color light before exiting the aperture. An encapsulant is disposed over the LED device. The system further comprises a light guide having an input portion and an output portion, the input portion configured to receive the uniform color light provided by the LED dice through the aperture, the input portion in attachment to the encapsulant of the package, and the output portion configured to transmit the uniform color light to the LCD screen.

In another embodiment, there is provided a method of manufacturing an opto-electronic package, the method comprising fabricating a substrate having a base and a plurality of cavity-defining walls, the base and the plurality of cavity-defining walls defining an elongate cavity having a major axis and an aperture, the base having a surface that presents within the cavity, the surface of the base that presents within the cavity having a plurality of mounting pads and a plurality of transverse walls that are interspersed along the major axis of the cavity, wherein the mounting pads are separated by the transverse walls, and wherein the transverse walls have lower heights than the cavity-defining walls; attaching a plurality of LED dice to the base of the substrate within the cavity; electrically connecting each one of the plurality of LED dice with a wire bond to one of a plurality of conductive traces in connection with an outer portion of the substrate; and disposing an encapsulant over the plurality of LED dice within the cavity.

In another embodiment, there is provided an opto-electronic package comprising a substrate having a base and a plurality of cavity-defining walls, the base and the plurality of cavity-defining walls defining an elongate cavity having a major axis and an aperture, the base having a surface that presents within the cavity, the surface of the base that presents within the cavity having a plurality of mounting pads extending there through that are interspersed along the major axis of the cavity; and a plurality of light emitting diode (LED) dice mounted to the mounting pads of the substrate so as to project light within the cavity, wherein the plurality of mounting pads extend through the surface of the base that presents within the cavity so as to allow heat transfer from each one of the LED dice to the ambient atmosphere along a route defined by the thickness of the mounting pads.

Other embodiments are also disclosed.

BRIEF DESCRIPTION OF THE DRAWINGS

Illustrative embodiments of the invention are illustrated in the drawings, in which:

FIGS. 13A illustrates a series of side emitting LEDs mounted in connection with a light guide; and FIG. 13B illustrates actuation of the side emitting LEDs shown in FIG. 13A producing a dark spot with no light, which creates hot spots and unutilized area on an LCD panel backlit by the light guide.

DETAILED DESCRIPTION OF AN EMBODIMENT

Figure 1:
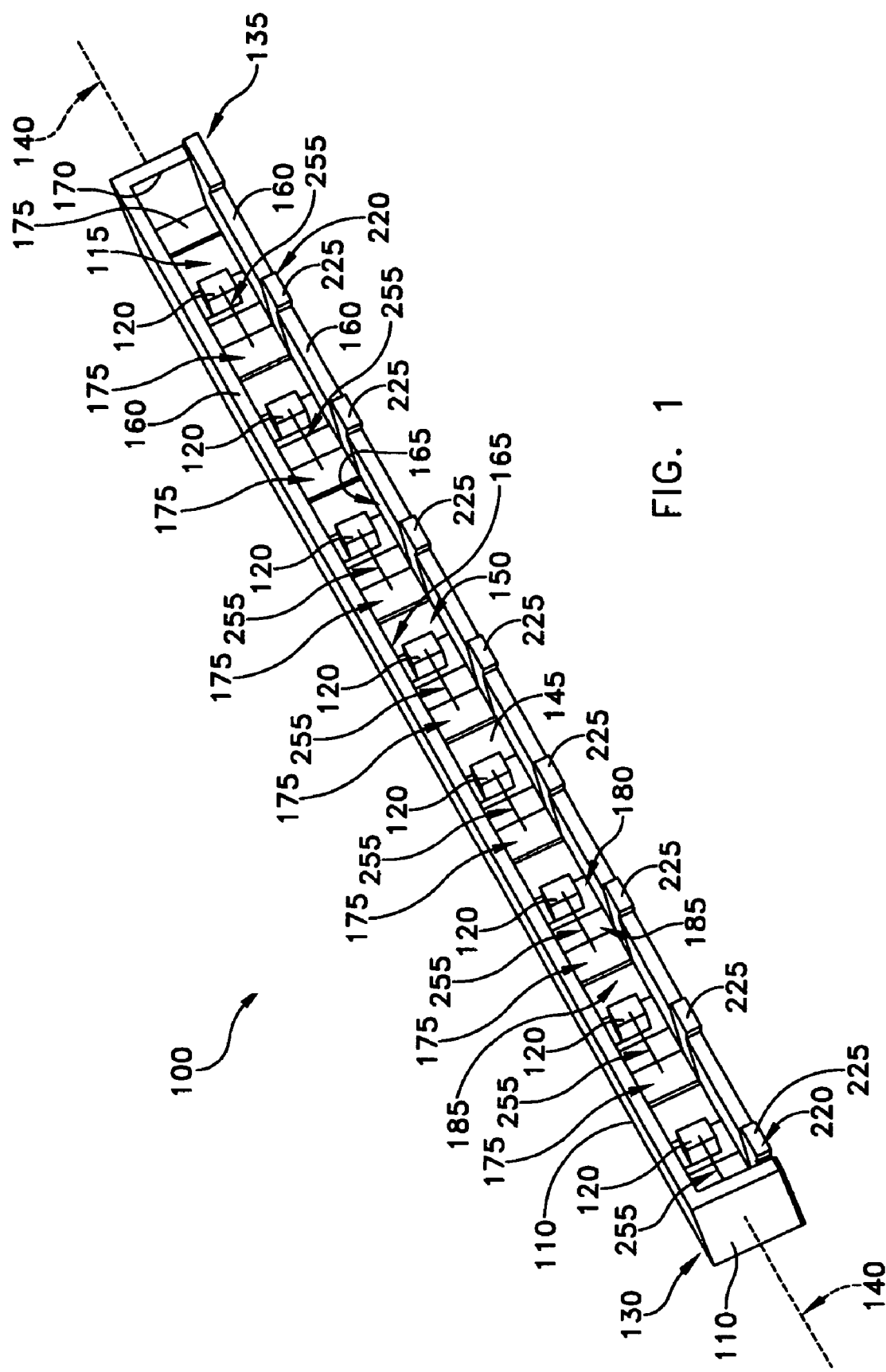
FIG. 1 illustrates an embodiment of an LED package design for a light source.
Figure 2:
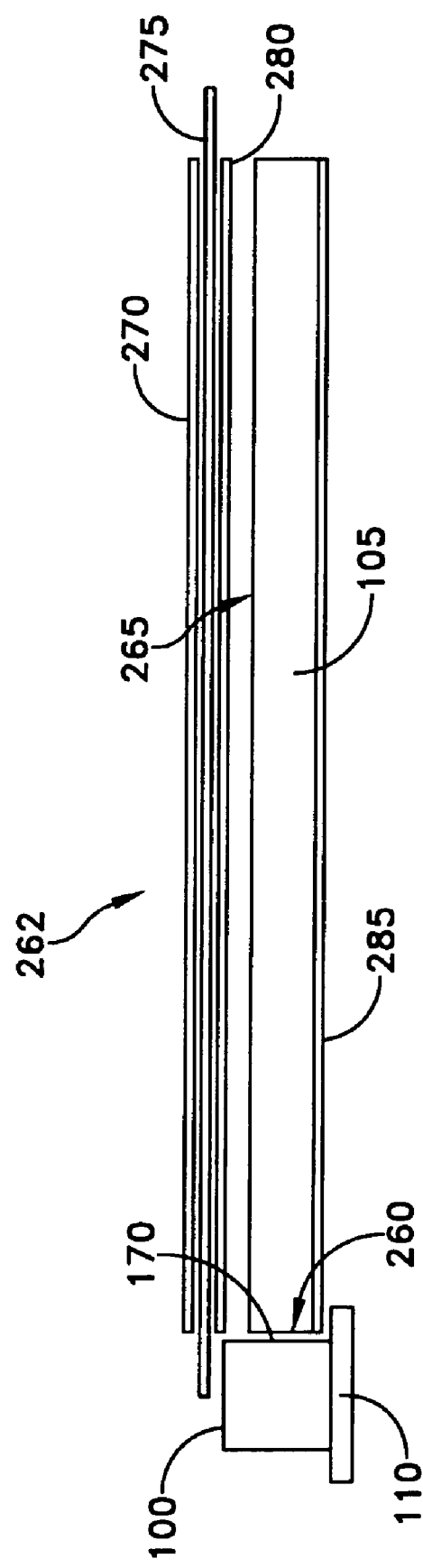
FIG. 2 illustrates a backlight unit system using the LED package of FIG. 1.
Figure 3:
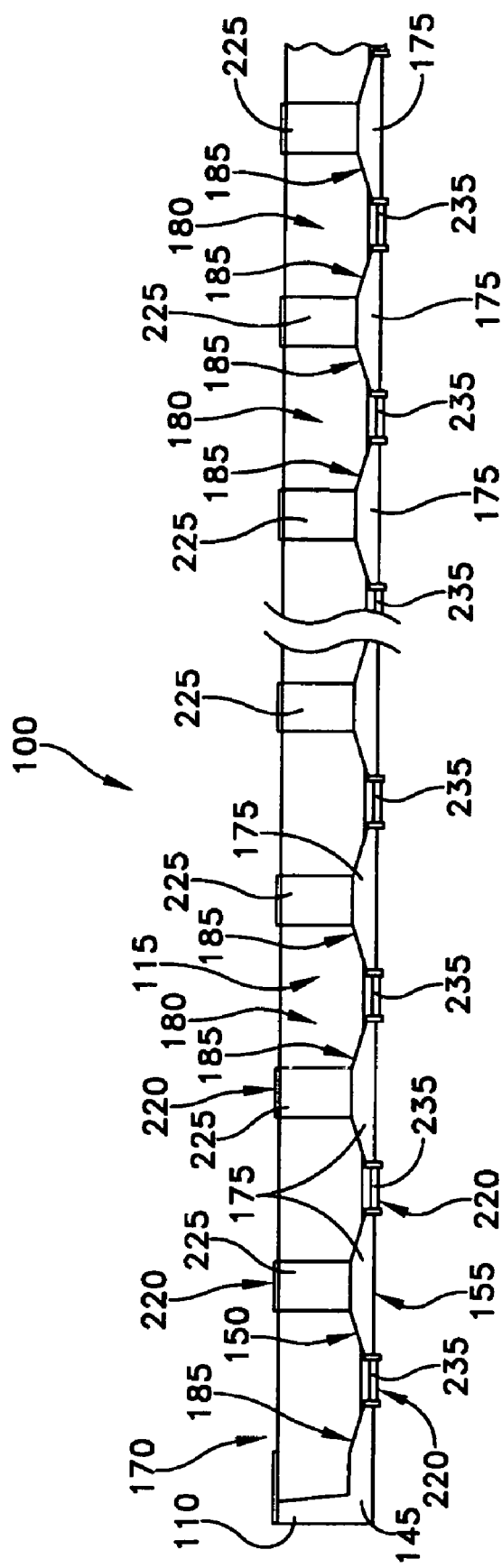
FIG. 3 illustrates a cross-sectional view of top conductive traces and bottom conductive traces disposed on the plastic substrate of the LED package shown in FIG. 1.
Figure 4:
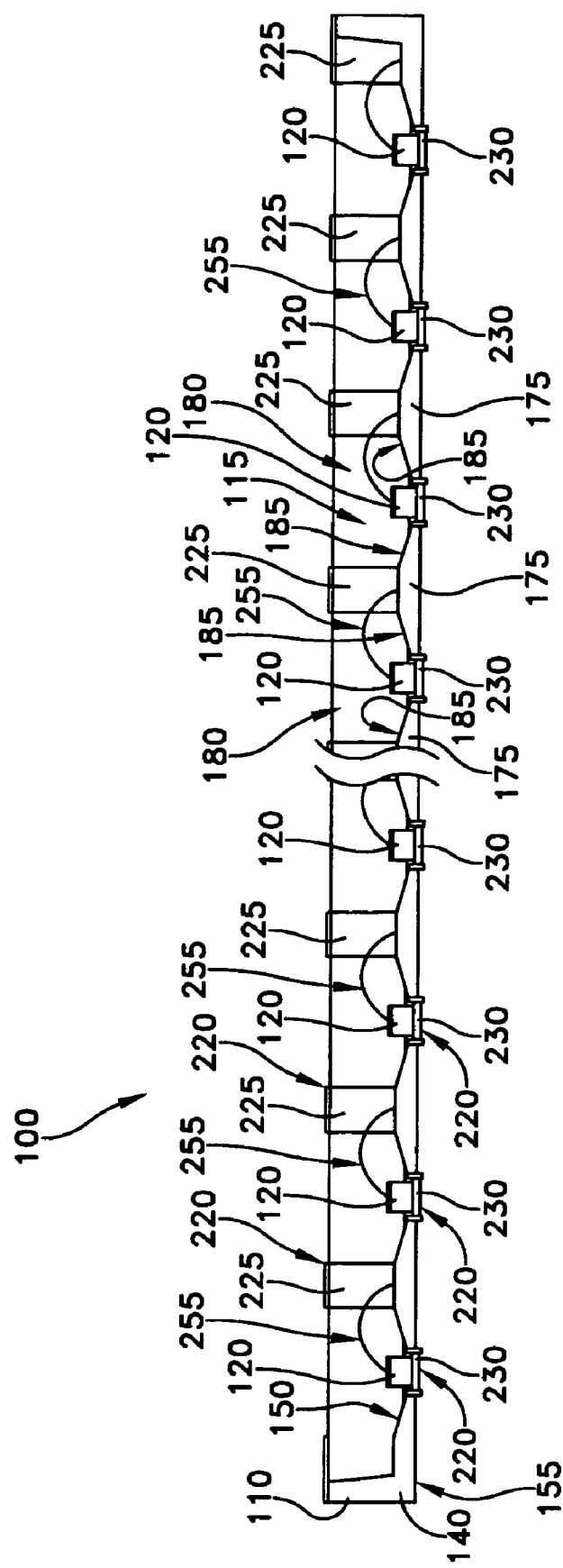
FIG. 4 illustrates a cross-sectional view of dice and wire bonds attached to the plastic substrate shown in FIG. 3.

Looking at FIGS. 1-5, and in an embodiment, an optoelectronic package 100 is provided to produce white light for a light guide 105 (FIG. 2). Looking at FIG. 1, optoelectronic package 100 includes a substrate 110, a cavity 115 formed within substrate 110, a plurality of LED dice 120 disposed within cavity 115 and in attachment to substrate 110. For example, substrate 110 may be formed of one or more various materials. The materials forming substrate 110 may include, but are not limited to, a plastic material or a ceramic material. In an embodiment, the plastic material forming substrate 110 may comprise a high temperature plastic. For example, substrate 110 may comprise liquid crystal polymer (LCP) or AMODEL polyphthalamide. In one embodiment, encapsulation material 125 (FIG. 5) is disposed within cavity 115 and covers each one of LED dice 120.

Referring still to FIG. 1, a first end 130 and a second end 135 of substrate 110 are in opposition to one another. A longitudinal axis 140 is formed between first end 130 and second end 135. A base portion 145 extends between first end 130 and second end 135 of substrate 110. A first side 150 and a second side 155 of base portion 145 are in opposition to one another. A pair of cavity-defining walls 160 extends away from first side 150 of base portion 145. A pair of opposed surfaces 165 of cavity-defining walls 160 are disposed toward one another.

Cavity-defining walls 160 extend between first end 130 and second end 135 of substrate 110. Cavity 115 is formed in substrate 110 between first side 150 of base portion 145 and opposed surfaces 165 of cavity-defining walls 160. An aperture 170 is formed in substrate 110 and extends into cavity 115 between cavity-defining walls 160 and aperture 170 is disposed in opposition to base portion 145.

Referring to FIGS. 12A, 12B, 13A and 13B, a disadvantage of this typical arrangement is that light must travel from LED die 20 through air prior to entry into light guide 10. This arrangement causes loss of light 35 due to Fresnel loss.

Figure 5:
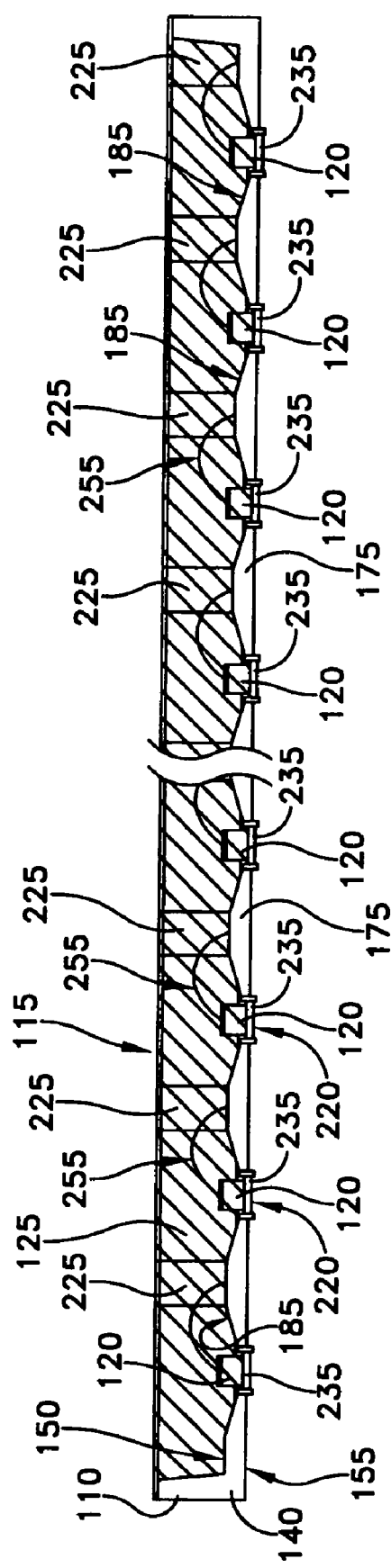
FIG. 5 illustrates a cross-sectional view of encapsulation material disposed within the cavity, and over the dice and wire bonds, of the plastic substrate shown in FIG. 4.
Figure 6:
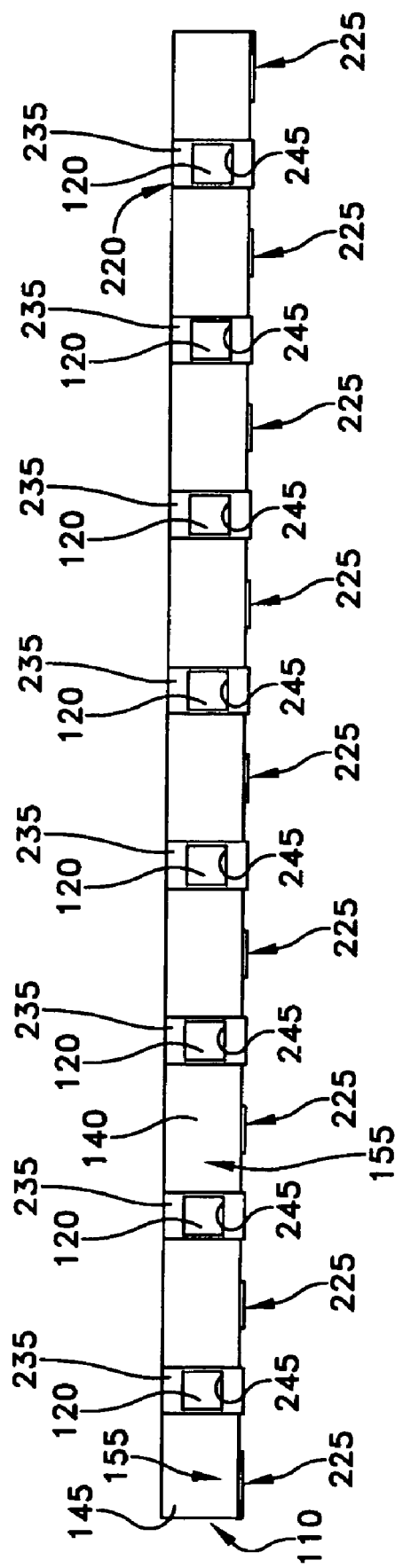
FIG. 6 illustrates a bottom plan view of individualized heat pads with passageways therethrough for each die so as to maximize the heat dissipation and so as to minimize the heat transfer between dice.

In an embodiment, each one of the plurality of LED dice 120 are mounted to first side 150 of substrate 110, and are mounted in a line with one another and in parallel to longitudinal axis 140. Referring to FIG. 5, and in one embodiment, encapsulation material 125, which is disposed within cavity 115 of substrate 110, receives light emitted from each one of the plurality of LED dice 120 and transmits this light directly to light guide 105. This arrangement of encapsulation material 125 significantly reduces light loss in that the light does not transition into a gaseous environment prior to entry into light guide 105. For example, encapsulation material 125 may comprise epoxy or silicone.

In an embodiment, encapsulation material 125 may comprise a diffuser contained therein. The diffuser within the encapsulation material 125 may be composed to aid in color mixing of light emitted from LED dice 120.

Figure 7:
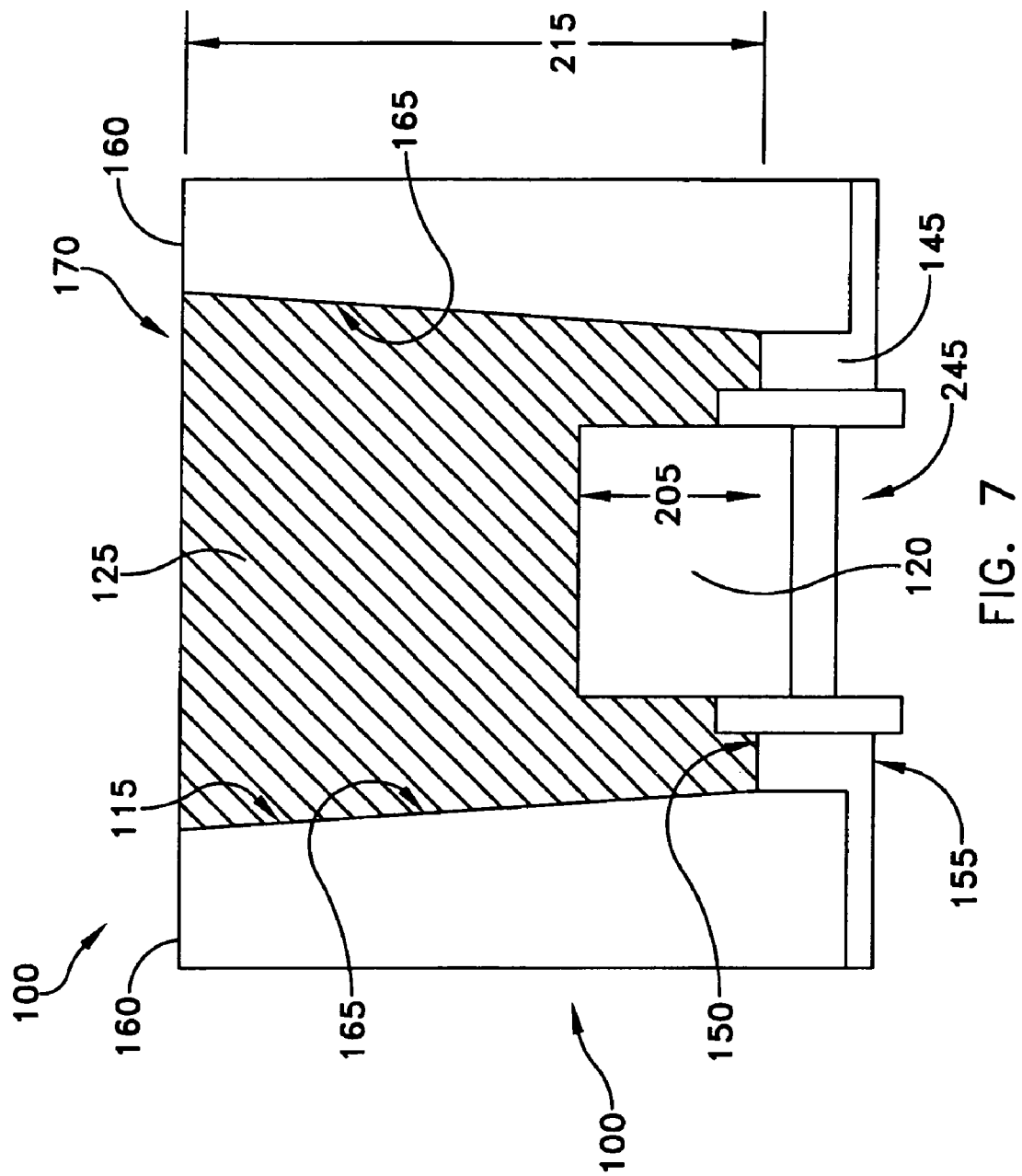
FIG. 7 illustrates a transverse cross-sectional view of the LED package of FIG. 1 so as to show a heat flow path.

Referring to FIG. 7, and in one embodiment, there is shown first side 150 of base portion 145 and opposed surfaces 165 of cavity-defining walls 160 configured to reflect light emitted from LED dice 120 through aperture 170 so as to provide white light to light guide 105 (FIG. 2). In an embodiment, walls 160 of plastic substrate 110 in cavity 115 are constructed at an angle to reflect emitted light toward aperture 170 of package 100 and to also provide more intense light.

Figure 8:
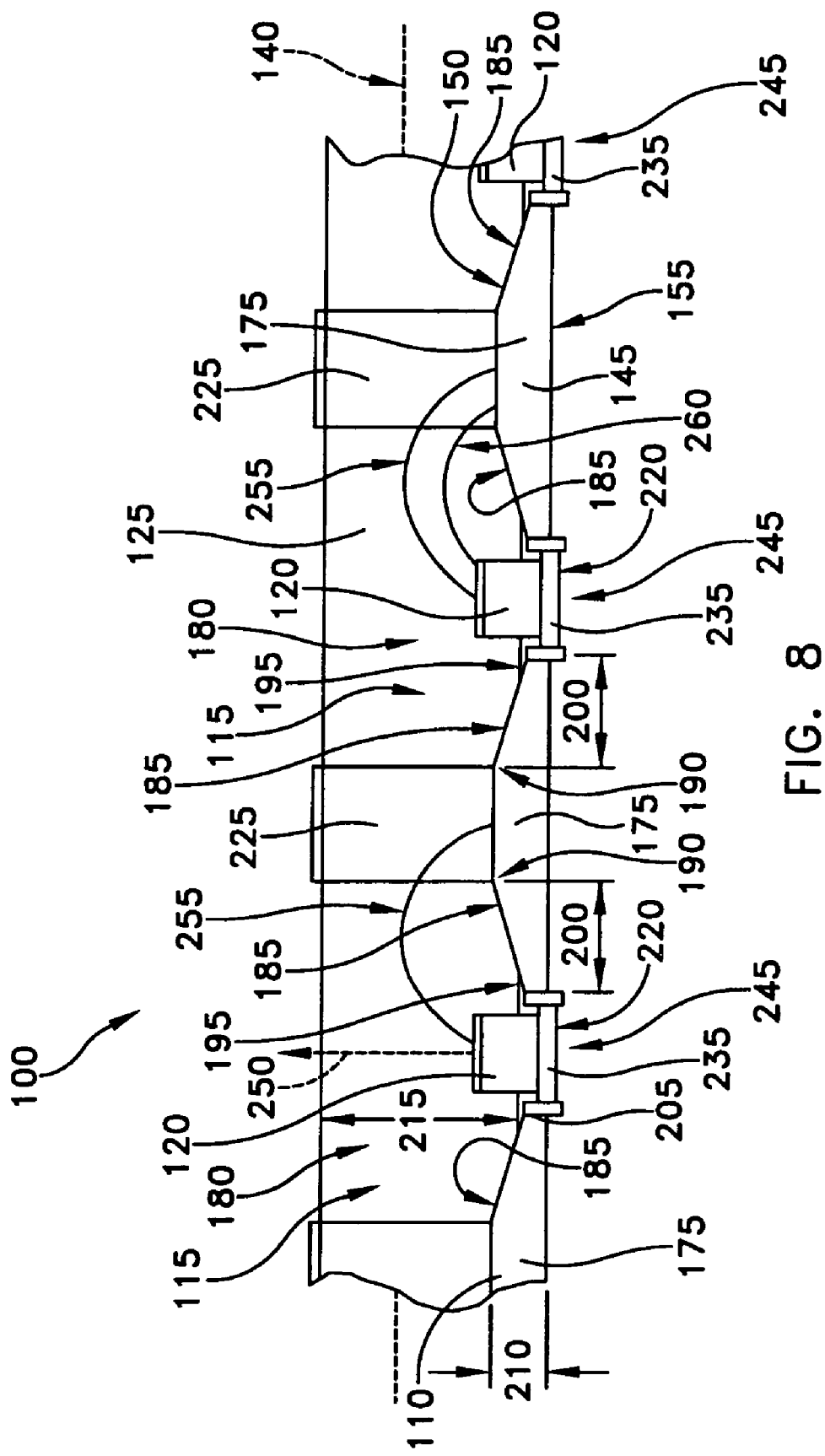
FIG. 8 illustrates an embodiment of an LED package having a transverse wall between two adjacent dice.

Referring to FIG. 8, and in one embodiment, a series of transverse walls 175 extend away from first surface 150 of base portion 145 of package 100 and extend between the pair of cavity-defining walls 160. Within plastic cavity 115, wall 175 either has a low height between two dice 120 or wall 175 is omitted. The purpose of the wall design is to minimize the light absorption between two dice 120 as light absorption can decrease the efficiency of each one of dice 120.

A reflector cup 180 may be formed on opposing sides of LED die 120 using upwardly tapering portions 185 of transverse walls 175 together with angled walls 160. Looking at FIG. 8, transverse walls 175 taper from a maximum height 190 to a minimum height 195 over a given distance 200 between adjacent LED dice 120. Angled wall 175 acts as an individual reflector cup 185 for each one of dice 120 so as to reflect more light to aperture 170. Reflector cup 185, including angled full plastic wall 160 and transverse wall 175, may be shaped to provide for better color mixing and also for better light intensity for each particular LED dice 120.

In one embodiment, transverse wall 175 may include a shaped portion. This shaped portion may include, for example, but is not limited to, a curved wall, a stepped wall or another configuration that provides better color mixing or better light intensity for LED dice 120.

Referring still to FIG. 8, and in an embodiment, package 100 has dimensions to allow color mixing within encapsulation material 125 of cavity 115 so as to produce white light prior to emission through aperture 170. Each one of the plurality of LED dice 120 forms a maximum height 205 from first side 150 of base portion 145. Each one of the plurality of transverse walls 175 has a maximum height 210, and cavity 115 has a maximum depth 215. Maximum height 205 of each one of the plurality of LED dice 120 may be less than half maxim depth 210 of cavity 115. Maximum height 205 of each one of the plurality of LED dice 120 may be at least twice maximum height 210 of each one of the plurality of transverse walls 175 so that color mixing can occur within the package to produce white light prior to emission through the aperture.

Referring to FIGS. 1, 3-6 and 8, 9 and 11, there is shown a plurality of metal portions 220 coated onto the plastic material of substrate 110. In an embodiment, metal portions 220 may comprise a copper material.

Figure 9:
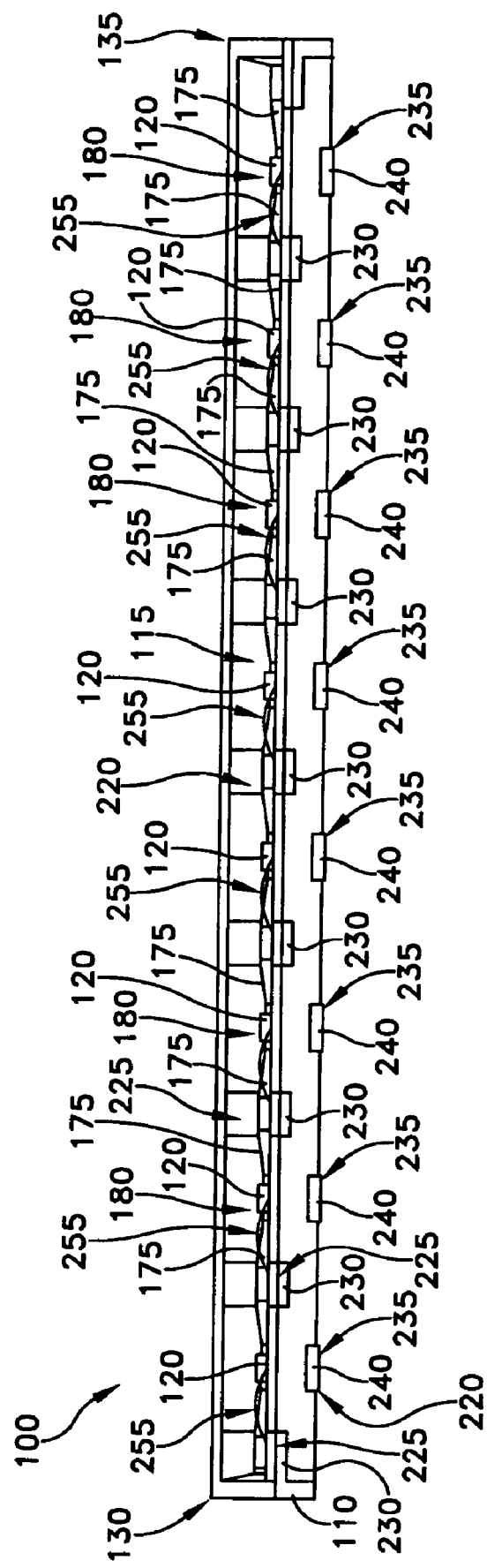
FIG. 9 illustrates a diagrammatic view of top conductive trace pads and bottom conductive trace used for external electrical connection.

Referring to FIG. 9, and in one embodiment, metal portions 220 may comprise a plurality of top conductive traces 225 extending from first side 150 of base portion 145, along one of opposed surfaces 165 of cavity-defining walls 160, and to a plurality of connector pads 230 disposed on an exterior portion of substrate 110. Top conductive traces 225 allow electrical connection to the upper portion of each of the plurality of LED dice 120 mounted adjacent to one of the plurality of top conductive traces 225 to each of the plurality of connector pads 230, respectively.

Referring still to FIG. 9, metal portions 220 may comprise a plurality of bottom conductive traces 235 disposed on second side 155 of base portion 145 and extend to a plurality of connector pads 240 disposed on an exterior portion of substrate 110. Bottom conductive traces 235 allow electrical connection of the lower portion of each of the plurality of LED dice 120 mounted adjacent to one of the plurality of bottom conductive traces 235 to each of the plurality of connector pads 240, respectively. Additionally, bottom conductive traces 235 function as heat sinks disposed on second side 155 of base portion 145, wherein each one of the plurality of LED dice 120 is in thermal connection to one of the plurality of heat sinks, respectively.

Figure 11:
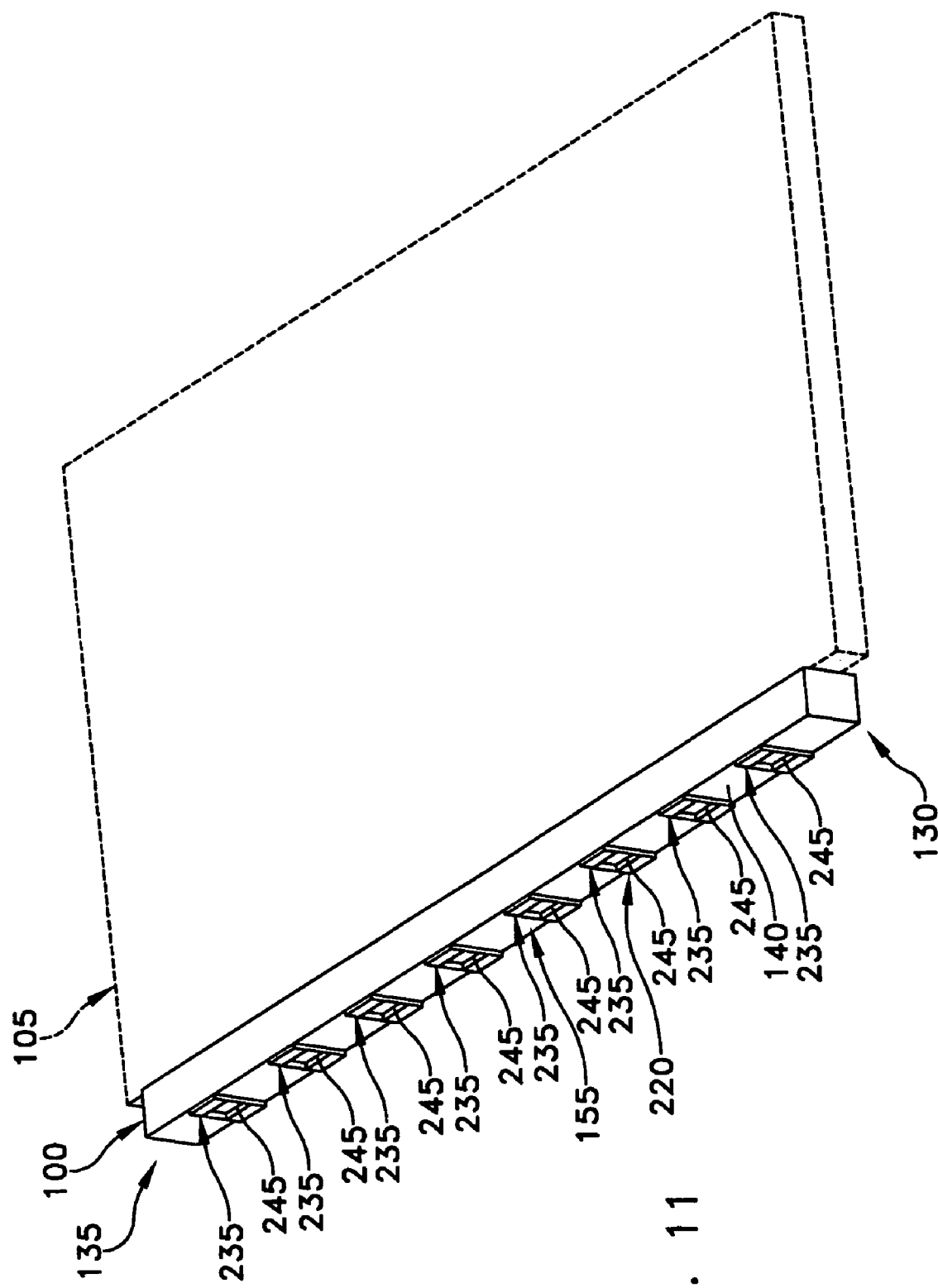
FIG. 11 illustrates the package of FIG. 1 coupled together with a light guide for backlighting an LCD screen.
Figure 12B:
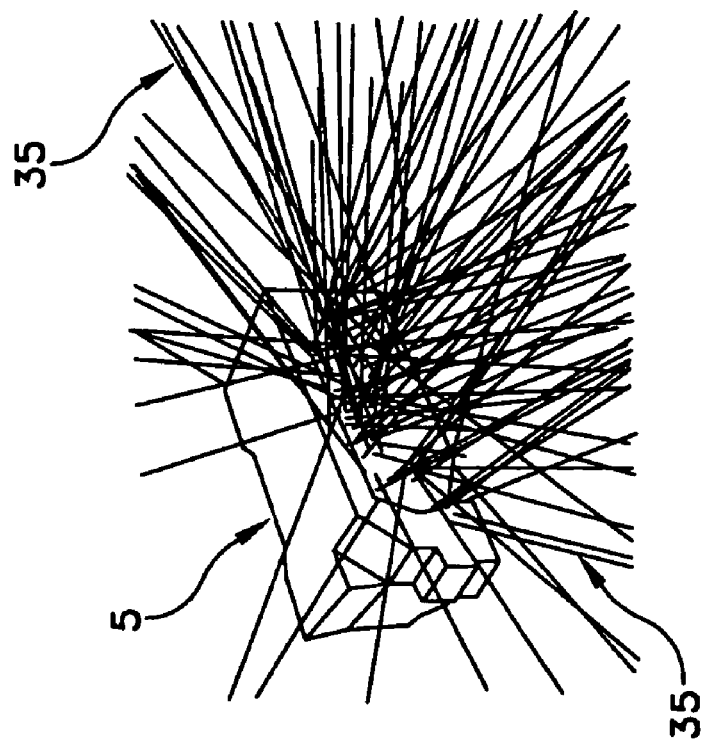
FIG. 12B illustrates a schematic illustration of emissions from the side emitting LED shown in FIG. 12A.
Figure 12A:
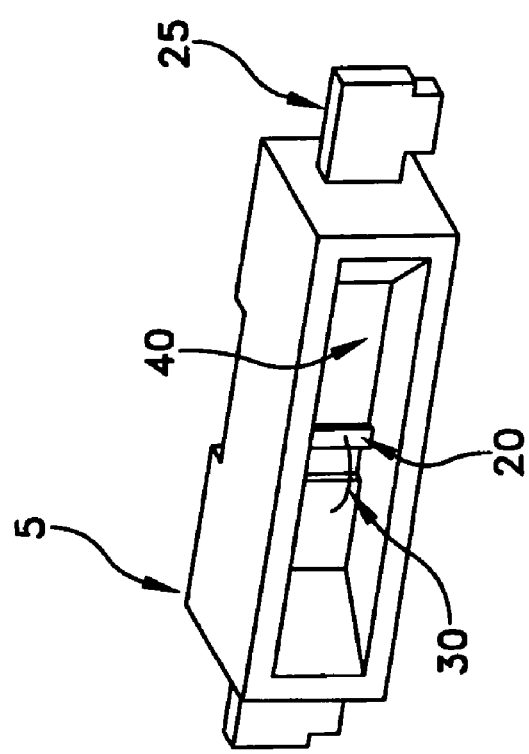
FIG. 12A illustrates a side emitting LED.

Referring to FIG. 11, and in an embodiment, recesses 245 may be formed into bottom conductive traces 235 to provide additional airflow to each of the plurality of LED dice 120. In an embodiment, substrate 110 is formed with a series of passageways through base portion 145. Metal portions 220 may be coated over at least a portion of these passageways so as to form bottom conductive traces 235. Heat dissipation is better than existing package designs inasmuch as bottom conductive traces 235 each have a wide surface area and at least a portion of bottom conductive trace 235 allows direct thermal conduction from LED dice 120 to the ambient atmosphere. Also, each of LED dice 120 is attached directly to a corresponding one of bottom conductive traces 235 so as to provide a very short thermal path.

In one embodiment, bottom conductive traces 235 may be provided without a recess. Trace 235 may be attached to a metal heat sink using thermal grease, thermal glue, or another compound that is thermally conductive. In an embodiment, heat generated by LED dice 120 is not very high so as to allow natural airflow to keep package 100 with LED dice 120 attached on the other side of trace 235 to cooled. In turn, this creates more efficient performance for LED dice 120 with brighter output or a lower light output efficiency drop rate.

Referring still to FIG. 11, and in one embodiment, the bottom portion of each one of the plurality of LED dice 120 are in electrical connection to a corresponding one of bottom conductive traces 120.

In an embodiment, the plurality of LED dice 120 mounted to first surface 150 of substrate 110 comprise a red LED die, a green LED die and a blue LED die.

In one embodiment, blue LEDs may be provided together with phosphor material disposed within cavity 115. A white colored light is formed by the light projected by the blue LEDs and the phosphor material disposed within cavity 115 such that white colored light is emitted through aperture 170. For example, the phosphor material may be contained in a premix of silicone or epoxy filling the cavity.

Referring to FIG. 8, and in one embodiment, the plurality of LED dice 120 are mounted to emit light in a direction 250 perpendicular to longitudinal axis 140 of base portion 145. In an embodiment, a single wire bond 255 electrically connects the top portion of each one of the plurality of LED dice 120. Optionally, a double wire bond 260 is in electrical connection with one or more of the plurality of LED dice 120.

In one embodiment, the number of LED dice 120 is chosen to form a length according to requirements of light guide 105 between first end 130 and second end 135 of substrate 110.

Referring to FIG. 2, and in an embodiment, there is provided a system 262 for backlighting an LCD screen. The system comprises opto-electronic package 100 and light guide 105 having an input portion 260 and an output portion 265. Input portion 260 is configured to receive the white light provided by package 100 through aperture 170. Input portion 260 may be in attachment to encapsulation material 125 of package 100. Output portion 265 is configured to transmit the white light to the LCD screen 270. In addition, a diffuser 275 and a prism sheet 280 may be provided between light guide 105 and LCD screen 270. A reflector 285 may also be positioned adjacent light guide 105 in opposition to LCD screen 270.

Figure 10:
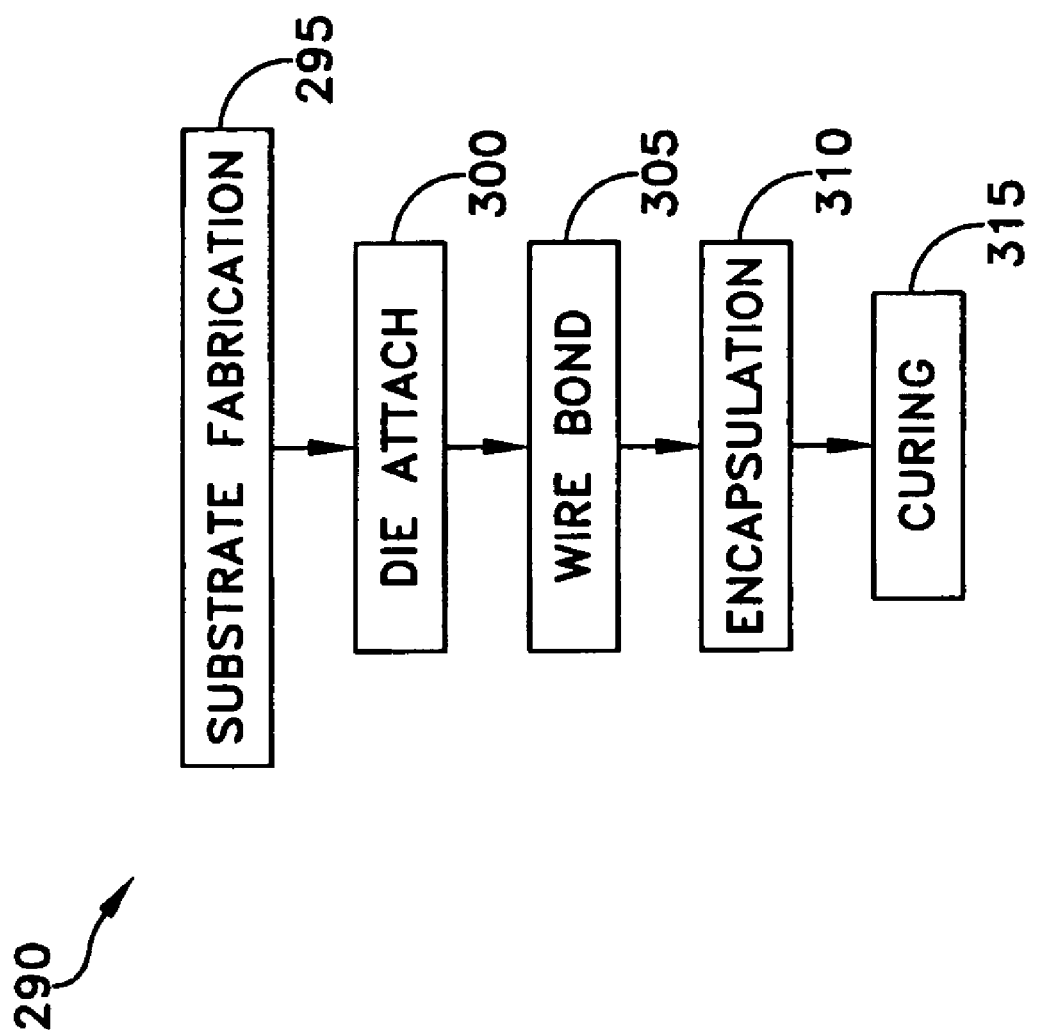
FIG. 10 illustrates flow chart related to the fabrication of an LED package.

Referring now to FIG. 10, there is shown a flow chart 290 illustrating a method of manufacturing an opto-electronic package 100 to produce white light for light guide 105 (FIG. 2). In an embodiment, the method comprises fabricating 295 substrate 110, attaching 300 plurality of LED dice 120 to first surface 150 of substrate 110 within cavity 115, electrically connecting 305 each one of the plurality of LED dice 120 to one of a plurality of conductive traces 220 in connection with an outer portion of substrate 110, and disposing 310 encapsulation material 125 within cavity 115 of substrate 110 so as to cover the plurality of LED dice 120. In addition, the method of manufacturing package 100 may include curing encapsulation material 125 after disposing encapsulation material 125 within cavity 115 of substrate 110.

In one embodiment, light is reflected and directed out of aperture 170 by the walls of package 100 so as to eliminate the need for a reflector to channel the light source. Aperture 170 may have a small sized opening through package 100 to ensure that all light is directed into light guide 105.

In an embodiment, electrically and thermally conductive adhesive is used to mount LED chips 120 onto substrate 110.

In order to achieve good color mixing and brightness uniformity, LED dice 120 are placed close to each other. Pitch between dice 120 may be optimized for color mixing within the package housing itself so that only a selected color of light, such as white light, is emitted outside package 100 without emitting individual dice color. This also reduces hot spots and unutilized LCD area when coupled with light guide 105. In a preferred embodiment, each one of LED dice 120 is individually addressable and connection between each one of LED dice 120 is done externally depending on application.

What is claimed is:

1. An opto-electronic package, comprising:
   a substrate having a base and a plurality of cavity-defining walls, the base and the plurality of cavity-defining walls defining an elongate cavity having a major axis and an aperture, the base having a surface that presents within the cavity, the surface of the base that presents within the cavity having a plurality of mounting pads and a plurality of transverse walls that are interspersed along the major axis of the cavity, wherein the mounting pads are separated by the transverse walls, and wherein the transverse walls have lower heights than the cavity-defining walls;
   a plurality of conductive metal traces extending from the surface that presents within the cavity of the base portion, along one of the plurality of cavity-defining walls, and to a plurality of connector pads disposed on an exterior portion of the substrate so as to provide electrical connection of each of the plurality of LED dice mounted adjacent to one of the plurality of conductive traces to each of the plurality of connector pads, respectively; and
   a plurality of light emitting diode (LED) dice mounted to the mounting pads of the substrate so as to project light within the cavity.

2. The package of claim 1, wherein at least two of the LED dice project light having different colors from one another, wherein the lower heights of the transverse walls enable the different color projected light from the plurality of LED dice to mix within the cavity to form a uniform color light before exiting the aperture.

3. The package of claim 1, wherein the plurality of LED dice mounted to the first surface of the substrate comprise a red LED die, a green LED die and a blue LED die.

4. The package of claim 1, wherein the plurality of LED dice mounted to the first surface of the substrate comprise blue LEDs, and further comprising a phosphor material disposed within the cavity, wherein a white colored light is formed by the light projected by the blue LEDs and the phosphor material disposed within the cavity, and further wherein the white colored light is emitted through the aperture.

5. The package of claim 1, wherein each of the plurality of transverse walls have a pair of opposed portions upwardly sloping toward one another in a direction away from adjacent ones of the mounting pads.

6. The package of claim 1, further comprising an encapsulant that is disposed over the LED dice within the cavity.

7. The package of claim 1, wherein a pair of the transverse walls are disposed in opposition to one another with one of the LED dice there between so as to form a reflector cup together with at least one of said plurality of cavity-defining walls surrounding the one of the LED dice there between.

8. The package of claim 1, wherein the plurality of LED dice has a maximum height, the plurality of transverse walls has a maximum height, the cavity has a maximum depth, the maximum height of the plurality of LED dice is less than half the maxim depth of the cavity, and the maximum height of the plurality of LED dice is at least twice the maximum height of the plurality of transverse walls.

9. The package of claim 1, wherein the substrate comprises a plastic material.

10. The package of claim 9, wherein the plastic material comprises a high temperature plastic.

11. The package of claim 10, wherein the high temperature plastic is a liquid crystal polymer (LCP).

12. The package of claim 10, wherein the high temperature plastic is polyphthalamide.

13. The package of claim 9, wherein said plurality of conductive metal traces are coated onto the plastic material of the substrate.

14. The package of claim 13, wherein the plurality of conductive metal traces comprise a plurality of heat sinks disposed through the base portion, wherin each one of the plurality of LED dice is in thermal connection to one of the plurality of heat sinks, respectively.

15. The package of claim 13, wherein the plurality of conductive metal traces comprise a copper material.

16. The package of claim 1, wherein a single wire bond provides an electrical connection between one of the plurality of LED dice and a corresponding one of the plurality of conductive metal traces.

17. The package of claim 1, wherein a double wire bond provides an electrical connection between one of the plurality of LED dice and a corresponding one of the plurality of conductive metal traces.

18. The package of claim 14, wherein a bottom portion of each one of the plurality of LED dice are in connection with corresponding ones of the plurality of heat sinks.

19. The package of claim 1, wherein the substrate comprises a ceramic material.

20. A system for backlighting an LCD screen, the system comprising:
    an opto-electronic package, comprising:
      a substrate having a base and a plurality of cavity-defining walls, the base and the plurality of cavity-defining walls defining an elongate cavity having a major axis and an aperture, the base having a surface that presents within the cavity, the surface of the base that presents within the cavity having a plurality of mounting pads and a plurality of transverse walls that are interspersed along the major axis of the cavity, wherein the mounting pads are separated by the transverse walls, and wherein the transverse walls have lower heights than the cavity-defining walls;
      a plurality of conductive metal traces extending from the surface that presents within the cavity of the base, along one of the plurality of cavity-defining walls, and to a plurality of connector pads disposed on an exterior portion of the substrate; and
      a plurality of light emitting diode (LED) dice mounted to the mounting pads of the substrate so as to project light within the cavity, wherein at least two of the LED dice project light having different colors from one another, wherein the lower heights of the transverse walls enable the different color projected light from the plurality of LED dice to mix within the cavity to form a uniform color light before exiting the aperture;
    an encapsulant disposed over the LED device; and
    a light guide having an input portion and an output portion, the input portion configured to receive the uniform color light provided by the LED dice through the aperture, the input portion in attachment to the encapsulant of the package, and the output portion configured to transmit the uniform color light to the LCD screen.

21. A method of manufacturing an opto-electronic package, comprising:

fabricating a substrate having a base and a plurality of cavity-defining walls, the base and the plurality of cavity-defining walls defining an elongate cavity having a major axis and an aperture, the base having a surface that presents within the cavity, the surface of the base that presents within the cavity having a plurality of mounting pads and a plurality of transverse walls that are interspersed along the major axis of the cavity, wherein the mounting pads are separated by the transverse walls, and wherein the transverse walls have lower heights than the cavity-defining walls;

attaching a plurality of LED dice to the base of the substrate within the cavity;

forming a plurality of conductive traces extending from the surface that presents within the cavity of the base, along one of the plurality of cavity-defining walls, and to a plurality of connector pads disposed on an exterior portion of the substrate; and electrically connecting each one of the plurality of LED dice with a wire bond to one of said plurality of conductive traces; and disposing an encapsulant over the plurality of LED dice within the cavity.

22. The method of claim 21, further comprising curing the encapsulant after disposing the encapsulant over the plurality of LED dice within the cavity.

23. An opto-electronic package, comprising:

a substrate having a base and a plurality of cavity-defining walls, the base and the plurality of cavity-defining walls defining an elongate cavity having a major axis and an aperture, the base having a surface that presents within the cavity, the surface of the base that presents within the cavity having a plurality of mounting pads extending there through that are interspersed along the major axis of the cavity;

a plurality of conductive metal traces extending from the surface that presents within the cavity of the base, along one of the plurality of cavity-defining walls, and to a plurality of connector pads disposed on an exterior portion of the substrate; and a plurality of light emitting diode (LED) dice mounted to the mounting pads of the substrate so as to project light within the cavity, wherein the plurality of mounting pads extend through the surface of the base that presents within the cavity so as to allow heat transfer from each one of the LED dice to the ambient atmosphere along a route defined by a thickness of the mounting pads.

24. The package of claim 23, further comprising an encapsulant that is disposed over the LED dice within the cavity.

25. The package of claim 23, further comprising a plurality of transverse walls that are interspersed along the major axis of the cavity, wherein the mounting pads are separated by sloped pairs of the transverse walls, wherein the transverse walls have opposed portions having an upward slope in a direction away from adjacent ones of mounting pads, and wherein the transverse walls have lower heights than the cavity-defining walls.

26. The package of claim 23, wherein at least two of the LED dice project light having different colors from one another, wherein the different color projected light from the LED dice are mixed together within the cavity to form a uniform color light before exiting the aperture.

* * * * *

UNITED STATES PATENT AND TRADEMARK OFFICE
CERTIFICATE OF CORRECTION

PATENT NO. : 7,311,420 B2  Page 1 of 1
APPLICATION NO. : 11/208834
DATED : December 25, 2007
INVENTOR(S) : Siew Kim Tan et al.

It is certified that error appears in the above-identified patent and that said Letters Patent is hereby corrected as shown below:

Column 7, Line 67, Claim 8, delete "maxim" and insert -- maximum --;

Column 8, Line 16, Claim 14, delete "wherin" and insert -- wherein --.

Signed and Sealed this

Second Day of November, 2010

David J. Kappos
*Director of the United States Patent and Trademark Office*